United States Patent
Moon et al.

(10) Patent No.: US 9,048,402 B2
(45) Date of Patent: Jun. 2, 2015

(54) EPOXY RESIN COMPOSITION AND LIGHT EMITTING APPARATUS

(71) Applicants: LG INNOTEK CO., LTD., Seoul (KR); KUKDO CHEMICAL CO., LTD., Seoul (KR)

(72) Inventors: Sung Bae Moon, Seoul (KR); Sang In Yoon, Seoul (KR); Jae Hun Jeong, Seoul (KR); Min Young Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/905,899

(22) Filed: May 30, 2013

(65) Prior Publication Data
US 2013/0320393 A1  Dec. 5, 2013

(30) Foreign Application Priority Data
May 31, 2012  (KR) .................. 10-2012-0058858

(51) Int. Cl.
| | |
|---|---|
| H01L 33/56 | (2010.01) |
| H01L 33/58 | (2010.01) |
| C08L 83/06 | (2006.01) |
| C08G 59/32 | (2006.01) |
| C08G 59/38 | (2006.01) |
| C08G 59/30 | (2006.01) |
| C08L 63/00 | (2006.01) |
| C08G 77/14 | (2006.01) |

(52) U.S. Cl.
CPC .............. *H01L 33/56* (2013.01); *C08L 63/00* (2013.01); *C08G 59/306* (2013.01); *C08G 59/3245* (2013.01); *C08G 59/38* (2013.01); *C08G 77/14* (2013.01); *C08L 83/06* (2013.01); *H01L 2224/48091* (2013.01); *H01L 2224/48247* (2013.01); *H01L 2924/0002* (2013.01)

(58) Field of Classification Search
CPC ......... C08L 63/00; C08L 63/06; C08L 83/04; C08G 59/306; C08G 59/38; C08G 59/3245
USPC .............................. 257/100; 525/476; 523/433
See application file for complete search history.

(56) References Cited

U.S. PATENT DOCUMENTS

2010/0289055 A1 * 11/2010 Tan et al. ................... 257/100
2011/0245363 A1 * 10/2011 Choi et al. .................... 522/64

FOREIGN PATENT DOCUMENTS

JP  2010285563 A  * 12/2010
JP  2012077219 A  *  4/2012

* cited by examiner

Primary Examiner — Randy Gulakowski
Assistant Examiner — Ha Nguyen
(74) Attorney, Agent, or Firm — Saliwanchik, Lloyd & Eisenschenk

(57) ABSTRACT

Disclosed are an epoxy resin composition and a light emitting apparatus. The epoxy resin composition includes a triazine derivative epoxy resin and a silicon-containing alicyclic epoxy resin.

16 Claims, 1 Drawing Sheet

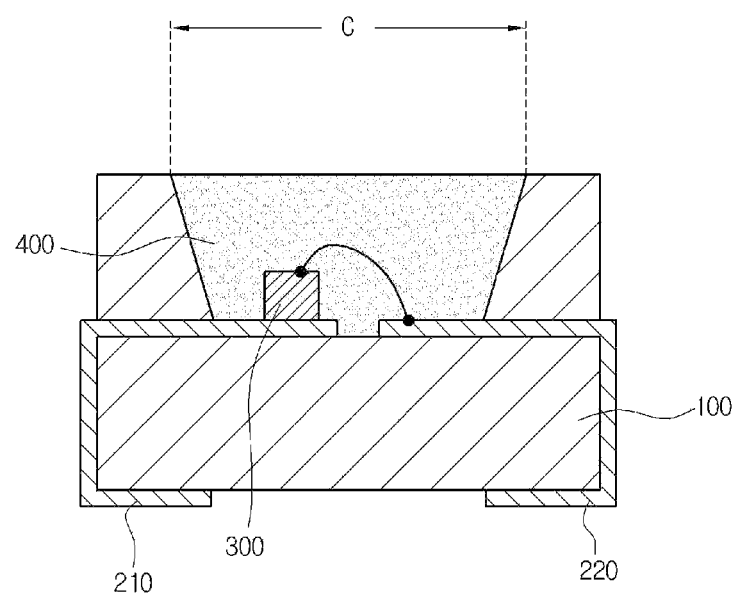

EPOXY RESIN COMPOSITION AND LIGHT EMITTING APPARATUS

CROSS-REFERENCE TO RELATED APPLICATION

This application claims the benefit under 35 U.S.C. §119 of Korean Patent Application No. 10-2012-0058858, filed May 31, 2012, which is hereby incorporated by reference in its entirety.

BACKGROUND

The embodiment relates to an epoxy resin composition and a light emitting apparatus.

Recently, GaN white light emitting diodes (LED) have been extensively manufactured over the whole world. Methods for manufacturing the GaN white LED are mainly classified into two methods, one is a method using a single chip, in which a white LED is obtained by forming a phosphor layer on a blue LED or a UV LED, and the other is a method using a multi-chip, in which two or more LEDs are combined to obtain a white LED.

A representative method for manufacturing the white LED in the form of the multi-chip is to combine three R, G and B chips with each other. However, since operating voltage of each chip is not uniform, the output of each chip may vary depending on the surrounding temperature so that the color coordinate may be changed.

Due to the above problem, the multi-chip scheme is not suitable for implementing the white LED, but suitable for a special-purpose lighting that reproduces various colors by controlling the brightness of each LED using the circuit configuration.

For this reason, the binary system, which can be easily manufactured and obtained by combining a blue LED with a phosphor that is excited by the blue LED to generate yellow color, is representatively used to implement the white LED.

The binary system mainly employs a white LED, which uses the blue LED as an excitation light source and excites YAG (Yttrium Aluminum Garnet) phosphor using rare-earth 3-valent ion of Ce3+ as an activator, i.e., YAG:Ce phosphor using an excitation light emitted from the blue LED.

In addition, the white LED employs various packages according to applications, and representatively includes a surface mounting device (SMD) type ultra-miniaturized LED used in a backlight of a handheld terminal, and a vertical lamp type LED used for an electronic board, a solid display device or an image display.

Meanwhile, an index for analyzing the characteristics of white light includes a correlated color temperature (CCT) and a color rendering index (CRI).

The CCT indicates a temperature of an article when the article shines with emitting visible rays, it seems that a color of the article is identical to a color that a black body radiates at a temperature and it is assumed that the temperature of the black body is equal to that of the article. As the CCT becomes high, the light dazzles a human and becomes a bluish white.

Therefore, in spite of identical white lights, when the CCT is low, people feel warm, whereas when the CCT is high, people feel cold. Accordingly, it is possible to meet even the specification of a particular lighting requiring various color feelings by adjusting the CCT.

In a conventional white LED using the YAG:Ce phosphor, the CCT is fixed only to 6000K-8000K.

The CRI indicates a degree that the color of an article is changed when sun light or artificial light is irradiated onto the article. When the color of the article is identical to that under sun light, the CRI is defined as 100. In other words, the CRI is an index to show how the color of the article under the artificial lighting is close to that under sun light, and has a value of 0 to 100.

Accordingly, as the CRI approaches 100, i.e., white light, people can feel that the color of the article under the artificial lighting has no difference than that under sun light.

At present, an incandescent lamp has a CRI of 80 or more and a fluorescent lamp has a CRI of 75 or more, while a white LED using YAG:Ce phosphor has a CRI of approximately 70-75.

Accordingly, it is problematic that the white LED using the conventional YAG:Ce phosphor has the low CCT and low CRI.

In addition, since only the YAG:Ce phosphor is used, it is difficult to control the CCT, CRI and color temperature.

The LED using such a phosphor is disclosed in Korean Unexamined Patent Publication No. 10-2005-0098462.

BRIEF SUMMARY

The embodiment provides an epoxy resin composition and a light emitting apparatus having improved reliability, optical properties and heat-resistant property.

The epoxy resin composition according to one embodiment includes a triazine derivative epoxy resin and a silicon-containing alicyclic epoxy resin.

The light emitting apparatus according to one embodiment includes a light emitting chip; a body part to receive the light emitting chip; and a filling part to cover the light emitting chip, wherein the body part includes a silicon-containing alicyclic resin.

According to one embodiment, the silicon-containing alicyclic epoxy resin may be expressed as a following chemical formula 1:

[chemical formula 1]

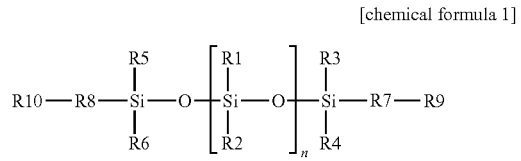

wherein n is 1 to 1000, R1, R2, R3, R4, R5 and R6 are, independently of one another, selected from hydrogen, a halogen group, an amino group, a $C_1$-$C_{30}$ alkyl group, an alkoxy group, a carboxyl group and a $C_5$-$C_{30}$ aryl group, R7 and R8 are substituted alicyclic hydrocarbon, and R9 and R10 are expressed as a following chemical formula 3:

[chemical formula 3]

wherein m is 1 to 3 and R12 is selected from hydrogen, a hydroxyl group, a halogen group, an amino group, a $C_1$-$C_{30}$ alkyl group, an alkoxy group, a carboxyl group and a $C_5$-$C_{30}$ aryl group.

According to one embodiment, the R7 and R8 may be expressed as a following chemical formula 2:

[chemical formula 2]

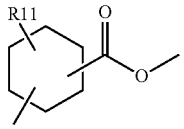

wherein R11 is selected from hydrogen, a hydroxyl group, a halogen group, an amino group, a $C_1$-$C_{30}$ alkyl group, an alkoxy group, a carboxyl group and a $C_5$-$C_{30}$ aryl group.

According to one embodiment, the R11 may be the hydroxyl group.

According to one embodiment, the triazine derivative epoxy resin comprises an isocyanurate epoxy resin.

According to one embodiment, the isocyanurate epoxy resin may be expressed as a following chemical formula 8:

[chemical formula 8]

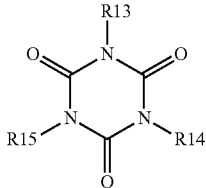

wherein at least one of R13, R14 and R15 is expressed as a following chemical formula 9 and a remaining of the R13, R14 and R15 is selected from hydrogen, a halogen group, an amino group, a $C_1$-$C_{30}$ alkyl group, an alkoxy group, a carboxyl group and a $C_5$-$C_{30}$ aryl group,

[chemical formula 9]

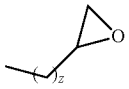

wherein z is 1 to 3.

According to one embodiment, the silicon-containing alicyclic epoxy resin is contained in the epoxy resin composition at a ratio of about 10 wt % to about 50 wt %.

According to one embodiment, the isocyanurate epoxy resin may include triglycidylisocyanurate.

According to one embodiment, the body part may be formed by using the epoxy resin composition including a triazine derivative epoxy resin and a silicon-containing alicyclic epoxy resin.

According to one embodiment, a cavity may be formed in the body part, the light emitting chip may be disposed in the cavity, the filling part may be disposed in the cavity and the body part may include a silicon resin.

According to one embodiment, the epoxy resin composition may further include a hardener, a catalyst, a dispersing agent and an antioxidant.

The epoxy resin composition according to the embodiment includes the triazine derivative epoxy resin and the silicon-containing alicyclic epoxy resin. Thus, the epoxy resin composition according to the embodiment may have the improved moisture-resistant property, heat-resistant property and transmittance.

The epoxy resin composition according to the embodiment may have the improved reliability and optical properties by appropriately combining the triazine derivative epoxy resin, such as the isocyanurate epoxy resin, with the silicon-containing alicyclic epoxy resin.

The epoxy resin composition according to the embodiment can be used for the body part of the light emitting apparatus, such as a light emitting diode package. Therefore, the light emitting apparatus according to the embodiment may have the improved reliability and optical properties. In particular, if the silicon resin is used for the filling part, both of the body part and the filling part include the silicon resin. Thus, the adhering force between the filling part and the body part can be improved. Accordingly, the light emitting chip can be effectively protected from external moisture and the light emitting diode package according to the embodiment may have the improved reliability and durability.

BRIEF DESCRIPTION OF THE DRAWING

FIG. 1 is a sectional view showing a light emitting diode package according to the embodiment.

DETAILED DESCRIPTION

Hereinafter, an epoxy resin composition according to the embodiment will be described in detail.

The epoxy resin composition according to one embodiment includes an epoxy resin, a hardener, a catalyst and an additive.

The epoxy resin may comprise the whole content of the epoxy resin composition according to the embodiment. The epoxy resin may be contained at a ratio of about 15 wt % to about 70 wt % based on the total content of the resin composition. In detail, the epoxy resin may be contained at a ratio of about 15 wt % to about 60 wt % based on the total content of the resin composition.

The epoxy resin may include a silicon-containing alicyclic epoxy resin and a triazine derivative epoxy resin. The silicon-containing alicyclic epoxy resin may be contained at a ratio of about 10 wt % to about 50 wt % based on the total content of the resin composition. In detail, the silicon-containing alicyclic epoxy resin may be contained at a ratio of about 15 wt % to about 35 wt % based on the total content of the resin composition.

If the epoxy resin composition according to the embodiment contains the silicon-containing alicyclic epoxy resin less than about 10 wt %, the optical property and moisture-resistant property of the epoxy resin composition may be deteriorated. In addition, if the epoxy resin composition according to the embodiment contains the silicon-containing alicyclic epoxy resin more than about 60 wt %, the heat-resistant property of the epoxy resin composition may be deteriorated.

In addition, the triazine derivative epoxy resin may be contained at a ratio of about 5 wt % to about 50 wt % based on the total content of the resin composition. In detail, the triazine derivative epoxy resin may be contained at a ratio of about 15 wt % to about 25 wt % based on the total content of the resin composition.

The silicon-containing alicyclic epoxy resin may be silicon-containing alicyclic hydrocarbon including at least one epoxy group. In detail, the silicon-containing alicyclic epoxy resin may include at least two epoxy groups and may have a structure in which siloxane is linked with alicyclic hydrocarbon. In more detail, the silicon-containing alicyclic epoxy resin may include cyclohexane linked with an epoxy group and the cyclohexane may be linked the siloxane. Further, the silicon-containing alicyclic epoxy resin may prepared by linking the siloxane with the alicyclic hydrocarbon and linking the epoxy group with the siloxane.

The silicon-containing alicyclic epoxy resin may be expressed as a following chemical formula 1:

[chemical formula 1]

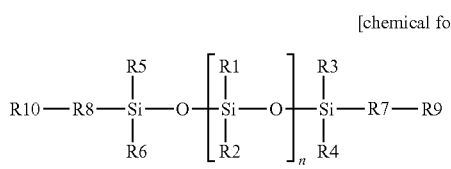

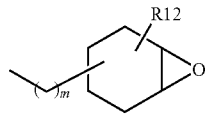

[chemical formula 3]

In the chemical formula 3, m may be 1 to 3. In detail, m may be 1 to 3. In more detail, m may be 1. In addition, R12 may be selected from hydrogen, a hydroxyl group, a halogen group, an amino group, a $C_1$-$C_{30}$ alkyl group, an alkoxy group, a carboxyl group and a $C_5$-$C_{30}$ aryl group.

In more detail, the silicon-containing alicyclic epoxy resin may be expressed as a following chemical formula 4:

[chemical formula 4]

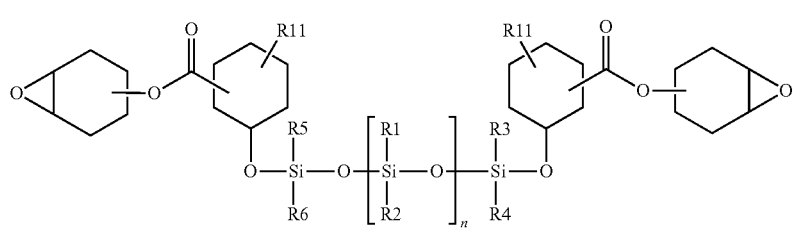

In the chemical formula 1, n may be 1 to 1000. In detail, n may be 1 to 10. In more detail, n may be 1 to 5. R1, R2, R3, R4, R5 and R6 may be, independently of one another, selected from hydrogen, a halogen group, an amino group, a $C_1$-$C_{30}$ alkyl group, an alkoxy group, a carboxyl group and a $C_5$-$C_{30}$ aryl group. In addition, at least one of the R1, R2, R3, R4, R5 and R6 may include the epoxy group. That is, at least one of the R1, R2, R3, R4, R5 and R6 may be substituted with the epoxy group.

In addition, R7 and R8 may include alicyclic hydrocarbon. In detail, the R7 and R8 may include cyclohexane. The R7 and R8 may include a ketone group. Further, the R7 and R8 may include an ether group. In detail, the R7 and R8 may include cyclohexane in which the ketone group is linked with the ether group. The R7 and R8 may be expressed as a following chemical formula 2:

[chemical formula 2]

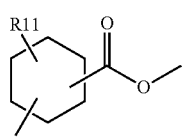

In the chemical formula 2, R11 may be selected from hydrogen, a hydroxyl group, a halogen group, an amino group, a $C_1$-$C_{30}$ alkyl group, an alkoxy group, a carboxyl group and a $C_5$-$C_{30}$ aryl group. In detail, the R11 may be the hydroxyl group.

R9 and R10 may be functional groups including epoxy groups. That is, the R9 and R10 may be alkyl groups substituted with epoxy groups. The R9 and R10 may be epoxy groups. In detail, the R9 and R10 may be expressed as a following chemical formula 3:

In the chemical formula 4, n may be 1 to 10. R1, R2, R3, R4, R5 and R6 may be, independently of one another, selected from hydrogen, a halogen group, an amino group, a $C_1$-$C_{30}$ alkyl group, an alkoxy group, a carboxyl group and a $C_5$-$C_{30}$ aryl group. In addition, at least one of the R1, R2, R3, R4, R5 and R6 may include the epoxy group. That is, at least one of the R1, R2, R3, R4, R5 and R6 may be substituted with the epoxy group. Further, R11 may be selected from hydrogen, a halogen group, an amino group, a $C_1$-$C_{30}$ alkyl group, a hydroxyl group, an alkoxy group, a carboxyl group and a $C_5$-$C_{30}$ aryl group. In detail, the R11 may be the hydroxyl group.

The silicon-containing alicyclic epoxy resin may be prepared by hydroxylation and condensation. In detail, siloxane as shown in a chemical formula 5 may be reacted into a material as shown in a chemical formula 6 through the hydroxylation. Then, the material shown in the chemical formula 6 is subject to the condensation with epoxy alicyclic alcohol shown in a chemical formula 7, so that the silicon-containing alicyclic epoxy resin can be prepared.

[chemical formula 5]

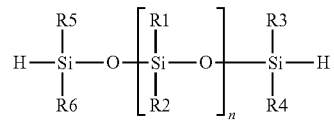

[chemical formula 6]

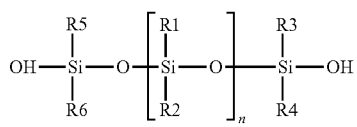

In the chemical formulas 5 and 6, R1, R2, R3, R4, R5 and R6 may be, independently of one another, selected from hydrogen, a halogen group, an amino group, a $C_1$-$C_{30}$ alkyl group, an alkoxy group, a carboxyl group and a $C_5$-$C_{30}$ aryl group.

[chemical formula 7]

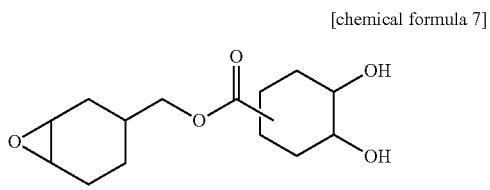

The triazine derivative epoxy resin may include triazine derivative having at least one epoxy group. In detail, the triazine derivative epoxy resin may include triazine derivative having three epoxy groups.

The triazine derivative epoxy resin may be an isocyanurate epoxy resin. That is, the triazine derivative epoxy resin may be expressed as a following chemical formula 8:

[chemical formula 8]

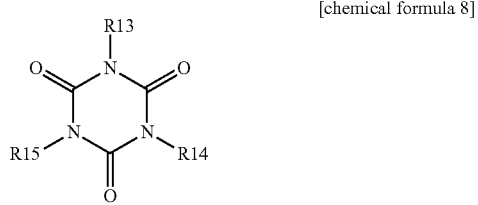

In the chemical formula 8, at least one of R13, R14 and R15 may be a functional group including an epoxy group. In detail, at least one of R13, R14 and R15 may be an alkyl group substituted with an epoxy group. At least one of R13, R14 and R15 may be an epoxy group. In detail, at least one of R13, R14 and R15 may be expressed as a following chemical formula 9.

[chemical formula 9]

In the chemical formula 9, z may be 1 to 3. In detail, z may be 1.

In addition, the remaining of the R13, R14 and R15 may be selected from hydrogen, a halogen group, an amino group, a $C_1$-$C_{30}$ alkyl group, an alkoxy group, a carboxyl group and a $C_5$-$C_{30}$ aryl group.

All of the R13, R14 and R15 may be functional groups including epoxy groups. In detail, the R13, R14 and R15 may be expressed as the above chemical formula 9.

In more detail, the isocyanurate epoxy resin may include triglycidylisocyanurate (TGIC).

In addition, the epoxy resin may further include other epoxy resins. In other words, the epoxy resin may further include typical epoxy resins having at least two epoxy groups in a molecule besides the triazine derivative epoxy resin and the alicyclic epoxy resin.

For instance, the epoxy resin may further include one or at least two of bisphenol A, 3,3',5,5'-tetramethyl-4,4'-dihydroxydiphenylmethane, 4,4'-dihydroxydiphenylsulfone, 4,4'-dihydroxydephenylsulfide, 4,4'-dihydroxydiphenylketone, fluorenebisphenol, 4,4'-biphenol, 3,3',5,5'-tetramethyl-4,4'-dihydroxybiphenyl, 2,2'-biphenol, resorcin, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allide or polyallide of dihydroxynaphthalene, allylbisphenol A, allylbisphenol F, divalent phenols such as allylphenolnovolac, or phenol novolac, bisphenolAnovolac, o-cresolnovolac, m-cresolnovolac, p-cresolnovolac, xylenolnovolac, poly-p-hydroxystyrene, tris-(4-hydroxyphenyl)methane, 1,1,2,2-tetrakis(4-hydroxyphenyl)ethane, fluoroglycinol, pyrogallol, t-butylpyrogallol, allidepyrogallol, polyallidepyrogallol, 1,2,4-benzenetriol, 2,3,4-trihydroxybenzophenone, phenolaralkyl resin, naphtholaralkyl resin, phenols of 3-valance or more such as dicyclopentadiene resin, and glycidylether derived from halogenated bisphenols such as tetrabromobisphenol.

Various types of hardeners generally known as epoxy resin hardeners may be used as the hardener for the epoxy resin composition according to the embodiment, preferably, a phenol hardener is used.

The hardener may be contained at a ratio of about 5 wt % to about 50 wt % based on the total content of the epoxy resin composition.

The phenol hardener is a single phenol compound and may include a phenol resin in addition to the phenol compound.

In detail, the phenol hardener may include bisphenol A, bisphenol F, 4,4'-dihydroxydiphenylmethane, 4,4'-dihydroxydiphenylether, 1,4-bis(4-hydroxyphenoxy)benzene, 1,3-bis(4-hydroxyphenoxy)benzene, 4,4'-dihydroxyphenylsulfide, 4,4'-dihydroxyldiphenylketone, 4,4'-dihydroxydiphenylsulfone, 4,4'-di hydroxydiphenyl, 2,2'-dihydroxydiphenyl, 10-(2,5-dihydroxyphenyl)-10H-9-oxa-10-phosphaphenanthrene-10-oxide, phenolnovolac, bisphenolAnovolac, o-cresolnovolac, m-cresolnovolac, p-cresolnovolac, xylenolnovolac, poly-p-hydroxystyrene, hydroquinone, resorcin, catechol, t-butylcatechol, t-butylhydroquinone, fluoroglycinol, pyrogallol, t-butylpyrogallol, allylpyrogallol, polyallylpyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allide or polyallide of the dihydroxynaphthalene, allylbisphenolA, allylbisphenolF, allylphenolnovolac, and allylpyrogallol.

The hardener may be prepared by mixing at least two types of hardeners.

Meanwhile, the hardener generally known in the art can be used instead of the phenol hardener. For instance, the hardener may include an amine hardener, an acid anhydride hardener, a phenol hardener, a polymercaptan hardener, a polyaminoamide hardener, an isocyanate hardener or a blocked isocyanate hardener. The content of the hardener may be appropriately set by taking into consideration the type of the hardener and the property of the thermal conductive epoxy resin to be obtained.

In detail, the amine hardener may include aliphatic amines, polyether polyamines, alicyclic amines, aromatic amines, and the like. The aliphatic amines may include ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine, tetra(hydroxyethyl) ethylenediamine, and the like. The polyether polyamines may include triethyleneglycolamine, tetraethyleneglycoldiamine, diethyleneglycolbis(propylamine), polyoxypropylenediamine, polyoxypropyleneamines, and the like. The alicyclic amines may include isophoronediamine, methendiamine, N-aminoethylpiperazine, bis(4-amino-3-methyldicyclohexyl)methane, bis(aminomethyl)cyclohexane, 3,9-bis(3-aminopropyl)2,4,8,10-tetra-oxaspiro(5,5)undecan, norbornenediamine and the like. The aromatic amines may include tetra-chloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-(dimethylamino-methyl)phenol, triethanolamine, methylbenzylamine, α-(m-aminophenyl)ethylamine, α-(p-amino-phenyl)ethylamine, diaminodiethyldimethyldiphenylmethane, α,α'-bis(4-aminophenyl)-p-diisopropylbenzene and the like.

The anhydride hardener may include dodecenylsuccinicanhydride, polyadipicacidanhydride, polyazelaicacidanhydride, polysebacicacidanhydride, poly(ethyloctadecanedoicacid)anhydride, poly(phenylhexadecanedoicacid) anhydride, methyltetrahydrophthalicanhydride, methylhexahydrophthalicanhydride, hexahydrophthalicanhydride, anhydrousmethylhimicacid, tetrahydrophthalicanhydride, trialkyltetrahydrophthalicanhydride, methylcyclohexenedicarboxylicacidanhydride, methylcyclohexenetetracarboxylicacidanhydride, phthalicanhydride, trimelliticanhydride, pyromelliticacidanhydride, benzophenonetetracarboxylicacidanhydride, ethylenegylcolbistrimellitate, anhydrousheticacid, anhydrousnadicacid, anhydrousmethylnadicacid, 5-(2,5-dioxotetrahydro-3-furanyl)-3-methyl-3-cyclohexane-1,2-dicarboxylicacidanhydride, 3,4-dicarboxy-1,2,3,4-tetrahydro-1-naphthalenesuccinicanhydride, 1-methyl-dicarboxy-1,2,3,4-tetrahydro-1-naphthalenesuccinicanhydride and the like.

The catalyst may promote the curing reaction of the epoxy resin composition according to the embodiment. The catalyst may be contained in the epoxy resin composition according to the embodiment at a ratio of about 0.1 wt % to about 2 wt %. The catalyst may include a metal, such as Pb, Pt or Ti.

The additive may be contained in the epoxy resin composition according to the embodiment at a ratio of about 0.1 wt % to about 10 wt %. The additive may include a dispersing agent, a leveling agent, and an antioxidant. The dispersing agent may include a silicon type dispersing agent.

In addition, the leveling agent may include a sulfonic compound or an ester compound. Further, the antioxidant may include phenyl-β-naphthylamine, aromatic amines or hydroquinone.

Hereinafter, a light emitting diode package will be described in detail with reference to FIG. 1.

In the description of the embodiments, it will be understood that when each substrate, layer, film or electrode is referred to as being "on" or "under" another substrate, layer, film or electrode, it can be "directly" or "indirectly" on or under another element or the other constituent elements may also be present. Such a position of the elements will be determined based on the drawings. The size of the elements shown in the drawings may be exaggerated for the purpose of explanation and may not utterly reflect the actual size.

FIG. 1 is a sectional view showing the light emitting diode package according to the embodiment.

Referring to FIG. 1, the light emitting diode package according to the embodiment includes a body part 100, lead electrodes 210 and 220, a light emitting chip 300 and a filling part 400.

The body part 100 includes a cavity having an open top surface. The cavity C may be formed by punching, cutting or etching the body part 100. In addition, the cavity C may be simultaneously formed with the body part 100 by using a metal mold having the internal structure identical to the cavity C.

The cavity C may have a cup shape or a concave container shape and a surface of the cavity C may have a circular shape, a polygonal shape or a random shape, but the embodiment is not limited thereto.

A sidewall of the cavity C may be vertical or inclined with respect to a bottom surface of the cavity C by taking a light distribution angle of the light emitting diode package according to the embodiment into consideration.

The lead electrodes 210 and 220 may be integrally formed with the body member 100. In detail, two lead electrodes 210 and 220 may be provided in one body part 100. The lead electrodes 210 and 220 may constitute a lead frame, but the embodiment is not limited thereto.

The lead electrodes 210 and 220 are disposed in the body part 100 such that the lead electrodes 210 and 220 can be electrically isolated from the bottom surface of the cavity C. Outer portions of the lead electrodes 210 and 220 may be exposed out of the body part 100.

End portions of the lead electrodes 210 and 220 may be disposed on one side of the cavity C or may be disposed opposite to the cavity C.

The lead electrodes 210 and 220 may be prepared in the form of a lead frame and the lead frame may be formed when the body part 100 is injection-molded. For instance, the lead electrodes 210 and 220 may include a first lead electrode 210 and a second lead electrode 220.

The first and second electrodes 210 and 220 are spaced apart from each other. The first and second lead electrodes 210 and 220 are electrically connected to the light emitting chip 300.

The light emitting chip 300 is disposed in the cavity C. The light emitting chip 300 is a light emitting unit that generates light. In detail, the light emitting chip 300 may be a light emitting diode chip that generates the light. For instance, the light emitting chip 300 may include a colored light emitting diode chip or a UV light emitting diode chip. One light emitting chip 300 may be disposed in one cavity C.

The filling part 400 is disposed in the cavity C. The filling part 400 is filled in the cavity C. The filling part 400 covers the light emitting chip 300. The filling part 400 may seal the light emitting chip 300 against external environment. In addition, the filling part 400 may have a convex shape to serve as a lens. In addition, phosphors may be distributed in the filling part 400.

The body part 100 may be formed by using the epoxy resin composition according to the embodiment. That is, the body part 100 can be formed by curing the epoxy resin composition according to the embodiment through a thermal curing process.

Accordingly, the body part 100 may include polymer including isocyanurate, alicyclic hydrocarbon and siloxane linked with each other through an ether group. In detail, the body part 100 and/or the filling part 400 may include polymer having a net structure which is prepared by linking isocyanurate, cyclohexane and siloxane with each other through an ether group.

Therefore, the body part 100 may have the improved moisture-resistant property, heat-resistant property and transmittance.

In addition, the filling part may be formed by using a silicon resin. For instance, the filling part 400 may be formed by curing a resin composition including polysiloxane, an epoxy resin and a silane resin.

The body part 100 is formed by using the epoxy resin composition including siloxane according to the embodiment and the filling part 400 includes the silicon resin. Thus, an adhesive force between the body part 100 and the filling part 400 can be improved.

As described above, the epoxy resin composition according to the embodiment includes a triazine derivative epoxy resin and a silicon-containing alicyclic epoxy resin. Thus, the epoxy resin composition according to the embodiment may have the improved moisture-resistant property, heat-resistant property and transmittance.

In other words, the epoxy resin composition according to the embodiment can be formed by appropriately combining a triazine derivative epoxy resin, such as isocyanurate epoxy resin, and a silicon-containing alicyclic epoxy resin so that the epoxy resin composition may have the improved reliability and optical property.

In addition, the epoxy resin composition according to the embodiment can be used for the body part 100. Thus, the light emitting diode package according to the embodiment can inhibit the body part 100 from being thermally deformed and inhibit the moisture from penetrating into the light emitting chip 300. Therefore, the light emitting diode package according to the embodiment may have the improved reliability and optical property.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Experimental Example and Comparative Example

Triglycidylisocyanurate (hereinafter referred to as epoxy resin 1), a silicon-containing alicyclic epoxy resin (hereinafter referred to as epoxy resin 2) expressed as the chemical formula 4 wherein n is 1 to 5, R1 to R6 are hydrogen and R11 is a hydroxyl group, a hardener (MeHHPA (Methylhexahydrophthalic anhydride) or HHPA (Hexahydrophthalic anhydride)), a catalyst (Triphenylphosphine) and an additive (phenyl-β-naphthylamine) were mixed as shown in Table 1 to prepare an epoxy resin composition.

Then, the thermal curing process was performed for about 2 hours at the temperature of about 100° C. to prepare a specimen having a thickness of about 2 mm. After that, the adhering force to a polysiloxane resin, the initial transmittance (measured with respect to a light having a wavelength band of 450 nm) and the transmittance retention (reduction of transmittance in comparison with the initial transmittance was measured with respect to a light having a wavelength band of 450 nm after leaving the specimen for 24 hours at the temperature of 175° C.) were measured, respectively.

TABLE 1

|  | Experimental Ex. 1 | Experimental Ex. 2 | Experimental Ex. 3 | Experimental Ex. 4 | Experimental Ex. 5 | Experimental Ex. 6 | Comparative Ex. 1 | Comparative Ex. 2 |
| --- | --- | --- | --- | --- | --- | --- | --- | --- |
| Epoxy resin 1 (wt %) | 33 | 23 | 13 | 33 | 23 | 13 | 46 | 0 |
| Epoxy resin 2 (wt %) | 13 | 23 | 33 | 13 | 23 | 33 | 0 | 46 |
| MeHHPA (wt %) | 50 | 50 | 50 |  |  |  | 50 | 50 |
| HHPA (wt %) |  |  |  | 50 | 50 | 50 |  |  |
| Catalyst (wt %) | 3 | 3 | 3 | 3 | 3 | 3 | 3 | 3 |
| Additive (wt %) | 1 | 1 | 1 | 1 | 1 | 1 | 1 | 1 |
| Adhering force to silicon resin | Δ | Δ | ○ | X | Δ | Δ | X | ○ |
| Initial transmittance (%) | 91 | 89 | 86 | 91 | 90 | 86 | 92 | 84 |
| Transmittance retention (%) | 94 | 95 | 96 | 92 | 92 | 94 | 83 | 93 |

Result

As can be understood from Table 1, experimental examples 1 to 6 represent the improved adhering property, heat-resistant property and optical property as compared with those of comparative examples 1 and 2.

What is claimed is:

1. An epoxy resin composition comprising:
   a triazine derivative epoxy resin; and
   a silicon-containing alicyclic epoxy resin,
   wherein the silicon-containing alicyclic epoxy resin is expressed as a following chemical formula 1:

[chemical formula 1]

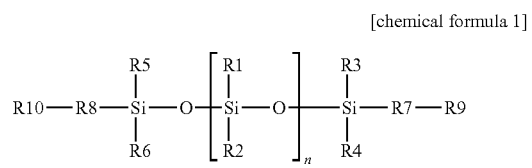

wherein n is 1 to 1000; R1, R2, R3, R4, R5, and R6 are, independently of one another, selected from hydrogen, a halogen group, an amino group, an alkoxy group, and a carboxyl group; wherein R9 and R10 are expressed as a following chemical formula 3:

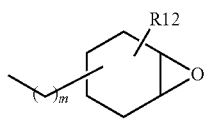

[chemical formula 3]

wherein m is 1 to 3 and R12 is selected from hydrogen, a hydroxyl group, a halogen group, an amino group, a $C_1$-$C_{30}$ alkyl group, an alkoxy group, a carboxyl group and a C5-C30 aryl group; and wherein the R7 and R8 are expressed as a following chemical formula 2:

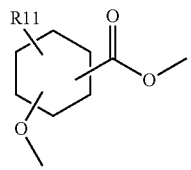

[chemical formula 2]

wherein R11 is selected from hydrogen, a hydroxyl group, a halogen group, an amino group, a C1-C30 alkyl group, an alkoxy group, a carboxyl group and a C5-C30 aryl group.

2. The epoxy resin composition of claim 1, wherein the R11 is the hydroxyl group.

3. The epoxy resin composition of claim 1, wherein the triazine derivative epoxy resin comprises an isocyanurate epoxy resin.

4. The epoxy resin composition of claim 3, wherein the isocyanurate epoxy resin is expressed as a following chemical formula 8:

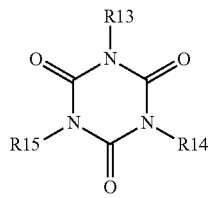

[chemical formula 8]

wherein at least one of R13, R14 and R15 is expressed as a following chemical formula 9 and a remaining of the R13, R14 and R15 is selected from hydrogen, a halogen group, an amino group, a $C_1$-$C_{30}$ alkyl group, an alkoxy group, a carboxyl group and a $C_5$-$C_{30}$ aryl group,

[chemical formula 9]

wherein z is 1 to 3.

5. The epoxy resin composition of claim 4, wherein the silicon-containing alicyclic epoxy resin is contained at a ratio of about 10 wt % to about 50 wt %.

6. The epoxy resin composition of claim 5, wherein the triazine derivative epoxy resin is contained at a ratio of about 10 wt % to about 50 wt %.

7. The epoxy resin composition of claim 4, wherein the isocyanurate epoxy resin comprises triglycidylisocyanurate.

8. The epoxy resin composition of claim 7, further comprising a hardener, a catalyst and an additive, wherein the additive comprises a dispersing agent, a leveling agent, and an antioxidant.

9. The epoxy resin composition of claim 8, wherein the hardener is contained at a ratio of about 5 wt % to about 50 wt % based on a total content of the epoxy resin composition, the catalyst is contained at a ratio of about 0.1 wt % to about 2 wt % based on the total content of the epoxy resin composition, and the additive is contained at a ratio of about 0.1 wt % to about 10 wt % based on the total content of the epoxy resin composition.

10. A light emitting apparatus comprising:
a light emitting chip;
a body part to receive the light emitting chip; and
a filling part to cover the light emitting chip,
wherein the body part comprises the epoxy resin composition of claim 1.

11. The light emitting apparatus of claim 10, wherein the triazine derivative epoxy resin comprises an isocyanurate epoxy resin expressed as a following chemical formula 8:

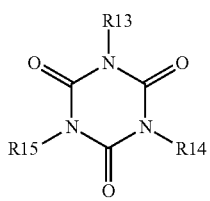

[chemical formula 8]

wherein at least one of R13, R14 and R15 is expressed as a following chemical formula 9 and a remaining of the R13, R14 and R15 is selected from hydrogen, a halogen group, an amino group, a $C_1$-$C_{30}$ alkyl group, an alkoxy group, a carboxyl group and a $C_5$-$C_{30}$ aryl group,

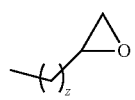

[chemical formula 9]

wherein z is 1 to 3.

12. The light emitting apparatus of claim 11, wherein a cavity is formed in the body part, the light emitting chip is disposed in the cavity, the filling part is disposed in the cavity and the filling part comprises a silicon resin.

13. The light emitting apparatus of claim 11, wherein the isocyanurate epoxy resin comprises triglycidylisocyanurate.

14. The light emitting apparatus of claim 11, wherein the silicon-containing alicyclic epoxy resin is contained at a ratio of about 10 wt % to about 50 wt % and the triazine derivative epoxy resin is contained at a ratio of about 10 wt % to about 50 wt %.

15. The light emitting apparatus of claim 10, wherein the epoxy resin composition further comprises a hardener, a catalyst and an additive, and the additive comprises a dispersing agent, a leveling agent, and an antioxidant.

16. The light emitting apparatus of claim 15, wherein the hardener is contained at a ratio of about 5 wt % to about 50 wt % based on a total content of the epoxy resin composition, the catalyst is contained at a ratio of about 0.1 wt % to about 2 wt % based on the total content of the epoxy resin composition, and the additive is contained at a ratio of about 0.1 wt % to about 10 wt % based on the total content of the epoxy resin composition.

* * * * *